United States Patent [19]
Winfield et al.

[11] Patent Number: 4,865,892
[45] Date of Patent: Sep. 12, 1989

[54] DIMENSIONALLY RECOVERABLE ARTICLE

[75] Inventors: Philip R. Winfield, Latton, Nr. Swindon; Nigel R. Bates, Swindon, both of England

[73] Assignee: Raychem Corporation, Menlo Park, Calif.

[21] Appl. No.: 81,205

[22] Filed: Aug. 3, 1987

[30] Foreign Application Priority Data

Aug. 8, 1986 [GB] United Kingdom ............... 8619398

[51] Int. Cl.$^4$ ............................................. B32B 15/00
[52] U.S. Cl. ...................................... 428/34.9; 156/86; 174/35 R; 428/284; 428/285; 428/286; 428/289; 428/283; 428/323; 428/35.1
[58] Field of Search ............... 156/84, 85, 86; 428/36, 428/284, 285, 286, 289, 283, 323; 174/35 R

[56] References Cited

U.S. PATENT DOCUMENTS

| | | | |
|---|---|---|---|
| 2,027,962 | 1/1936 | Currie | 18/55 |
| 3,086,242 | 4/1963 | Cook et al. | 18/1 |
| 3,597,372 | 8/1971 | Cook | 260/4 |
| 4,018,733 | 4/1977 | Lopez et al. | 260/27 |
| 4,181,775 | 1/1980 | Corke | 428/348 |
| 4,228,194 | 9/1980 | Meeder | 428/288 |
| 4,275,180 | 6/1981 | Clarke | 525/173 |
| 4,684,762 | 8/1987 | Gladfelter | 428/229 |

FOREIGN PATENT DOCUMENTS

| | | |
|---|---|---|
| 0116393 | 8/1984 | European Pat. Off. . |
| 0140664 | 8/1985 | European Pat. Off. . |
| 990235 | 4/1965 | United Kingdom . |
| 1010064 | 11/1965 | United Kingdom . |
| 1284082 | 8/1972 | United Kingdom . |
| 1294665 | 11/1972 | United Kingdom . |
| 1440524 | 6/1976 | United Kingdom . |
| 1556677 | 11/1979 | United Kingdom . |
| 2113022A | 12/1981 | United Kingdom . |
| 2104800A | 3/1983 | United Kingdom . |

OTHER PUBLICATIONS

The Selection and Use of Free Radical Initiators by Sheppard, C. S., et al.; Polymer Engineering and Science, Jul. 1979, vol. 19, No. 9.
Abandoned application, U.S. Ser. No. 757,212; Holt et al.; Tubular Article; 19 Jul. 1985.
Brochure entitled "Optimised and Superscreened Cables"; Raychem Ltd., Wire and Cable Division; Jul. 1, 1981.
Index to "Electroplating" by Frederick A. Lowenheim; McGraw-Hill.
International Specification IEC 96-1.
British Standard 2316.

Primary Examiner—James J. Bell
Attorney, Agent, or Firm—A. Stephen Zavell; Herbert G. Burkard

[57] ABSTRACT

A dimensionally recoverable article, preferably a heat-recoverable article, for providing an electromagnetic shield as a shielding layer which comprises an electrically conductive fabric. The fabric may be a non-woven fabric formed from electrically conductive fabrics or it may be a fabric that has been coated, for example with a metal, after it has been formed in order to render it electrically conductive.

22 Claims, 2 Drawing Sheets

DIMENSIONALLY RECOVERABLE ARTICLE

This invention relates to dimensionally recoverable articles, and in particular to articles for enclosing parts of objects such as electrical equipment and shielding them electromagnetic interference (EMI).

Dimensionally recoverable articles are articles the dimensional configuration of which may be made to change when subjected to the appropriate treatment. Of particular interest are heat-recoverable articles which recover, on heating, towards and original shape from which they have previously been deformed but the term "heat-recoverable", as used herein, also includes an article which, on heating, adopts a new configuration, even if it has not been previously deformed.

In their most common form, such articles comprise a heat-shrinkable sleeve made from a polymeric material exhibiting the property of elastic or plastic memory as described, for example, in U.S. Pat. Nos. 2,027,962; 3,086,242 and 3,597,372. As is made clear in, for example, U.S. Pat. No. 2,027,962, the original dimensionally heat-stable form may be a transient form in a continuous process in which, for example, an extruded tube is expanded, whilst hot, to a dimensionally heat-unstable form but, in other applications, a preformed dimensionally heat-stable article is deformed to a dimensionally heat-unstable form in a separate stage.

In the production of heat-recoverable articles, the polymeric material may be cross-linked at any stage in the production of the article that will enhance the desired dimensionally recoverability.

One manner of producing a heat-recoverable article comprises shaping the polymeric material into the desired heat-stable form, subsequently cross-linking the polymeric material, heating the article to a temperature above the crystalline melting point or, for amorphous materials the softening point, as the case may be, of the polymer, deforming the article and cooling the article whilst in the deformed state so that the deformed state of the article is retained. In use, since the deformed state of the article is heat-unstable, application of heat will cause the article to assume its original heat-stable shape. Alternatively the sleeve may be formed from a fabric, preferably a woven fabric, that employs heat-shrinkable fibres and preferably also a polymer matrix, for example as described in European patent specification No. 116,393.

Alternatively the article may be formed from a fabric, preferably a woven fabric, that employs heat-shrinkable fibres and preferably also a polymer matrix, for example as described in European patent specification No. 116,393, the disclosure of which is incorporated herein by reference.

In other articles, as described, for example, in British Pat. No. 1,440,524, an elastomeric member such as an outer tubular member is held in a stretched state by a second member, such as an inner tubular member, which, upon heating weakens and thus allows the elastomeric member to recover.

Examples of dimensionally recoverable articles that can be made to recover other than by heat include solvent recoverable articles which can recover on the application or evaporation of a solvent, articles as described in British patent specification No. 1,556,677, in which an elastomeric member is held in a stretched state by a rigid member that can be disbonded therefrom, or elastomeric conformable articles as described in the European Patent Applications filed in the name of Raychem Corporation (Holt/Larsson) claiming priority from U.S. application Ser. No. 757,212 dated 19th July, 1985. The disclosures of all the above specifications are incorporated herein by reference.

In recent years such articles have become widely used for providing mechanical and environmental protection for electrical equipment such as cables and electrical harnesses. Often it is desired to provide the cable or harness with a shield to screen the wires from electrical, magnetic or electromagnetic interference or to prevent interference in neighbouring equipment caused by the cable or harness. The shield may be provided in a number of ways, for example by means of metal braids, conductive metal paints or by metal fixtures. It has been proposed to provide dimensionally-recoverable articles that are used to enclose parts of cable or harnesses with a thin coat of metal paint in order to screen the cable or harness from electromagnetic interference. However the shielding efficiency of such articles is low, usually being not more than 30 to 50 dB.

One form of dimensionally recoverable articles that provides excellent EMI shielding is described in British patent application No. 2,113,022A. That article has an internal surface which is plated with a metal for shielding purposes, and which is profiled to form a number of axial grooves. The grooves fold together like a concertina when the article is recovered to enable the metal plating to accommodate recovery of the article. While the screening performance of that article is excellent, the article has a number of limitations affecting its use: For example the presence of the metal coating restricts the maximum recovery ratio to about 3:1 in practice. This means that in certain instances an expanded article cannot be slipped over an installed connector. Also, in contrast with unplated articles, there is a limit to the number of times the article can be heated and rolled back on itself to expose the enclosed wiring without impairing the shielding effectiveness of the article sine the plated axial grooves make the article relatively rigid. Thus there is a need for an article that combines high electromagnetic shielding effectiveness with the ability to be used in circumstances where repair of the enclosed object is required.

According to one aspect, the present invention provides a dimensionally recoverable article for enclosing at least part of an object and providing an electromagnetic shield, the article having a shielding layer which comprises a non-woven fabric formed at least partly from fibres that are electrically conductive.

The term "non-woven fabric" as used herein is intended to mean a structure that is produced by bonding or interlocking of fibres, or both, but does not include paper or fabrics that are woven, knitted, tufted or braided. If the fibres are bonded together, this may be accomplished by mechanical, chemical, thermal or solvent means or combinations thereof.

Preferably a major part of the fibres, and especially substantially all the fibres are electrically conductive. The electrically conductive fibres may be metallic or they may be formed from an electrically non-conductive material, e.g. a polymeric material, and have been coated with an electrically conductive material to render them conductive, as explained in more detail below. If the fabric is formed from metallic fibres, it preferably has a density of at least 6, more preferably at least 30, especially at least 60 and most especially at least 150 kgm$^{-3}$, but preferably not more than 1800, more preferably not more than 600 and most preferably not more than 300 kgm$^{-3}$. In addition to alternatively the screening layer preferably has a weight of at least 25, more preferably at least 50 and especially at least 250 gm$^{-2}$, but preferably not more than 3,500 more preferably not more than 2,500 and especially not more than 1000 gm$^{-2}$.

If the fibres are polymeric they may be coated with electrically conductive material either before or after the fabric is formed from the fibres, preferably after the fabric is formed. Thus, according to another aspect, the invention provides a dimensionally recoverable article for enclosing at least part of an object and providing an electromagnetic shield, the article having a shielding layer which comprises a fabric that has been coated with an electrically conductive material to render it conductive.

Preferably the fabric in the second aspect of the invention also has an open structure in order to enable it to conform to the configuration of the article during recovery thereof. In the case of certain articles for example extruded tubular articles, the article will have the same general geometry, e.g. cylindrical, before and after recovery. However, in the case of other articles such as moulded articles, the article will change from a substantially cylindrical configuration to a substantially "bottle-shaped" configuration. In such cases, and in other cases, surfaces of the article or parts of the article surface may change from one of substantially cylindrical geometry to one of an anticlastic or synclastic geometry or may change to a surface that has different portions having anticlastic or synclastic geometry. In view of this it may be difficult for the fabric to be able to conform to the changing geometry of the surface unless it has a relatively high free volume, that is to say, unless the proportion of the fabric volume that is occupied by the fibres is relatively low. Preferably the proportion of fabric volume occupied by the fibres is not more than 20%, more preferably not more than 10% most preferably not more than 7% and especially not more than 5%. The proportion may easily be determined by dividing the density of the (unplated) fabric as a whole by the density of the fibres. The bulk or free volume of the fabric may be increased by choosing a fabric that is knitted or in the form of a non-woven fabric (as defined above) rather than one that is woven. Non-woven fabrics are most preferred since they exhibit the highest ability to be compressed or otherwise distorted in the plane of the fabric without puckering or lifting off the surface of the article.

The (uncoated) fabric preferably has a density of at least 2, more preferably at least 5, especially at least 20 and most especially at least 50 kgm$^{-3}$, but preferably not more than 300, more preferably not more than 200 and most preferably not more than 100kgm$^{-3}$. The fabric, whether a metal fabric or a coated polymer fabric, also preferably has a thickness of at least 0.5 mm, more preferably at least 1 mm and especially at least 2 mm, but preferably not more than 5 mm and especially not more than 3 mm. Too thin a fabric will not normally achieve the required combination of shielding effectiveness and conformability while too thick a fabric will leave insufficient room within the article for the wiring and other components.

The electrically conductive material that coats the fabric is preferably a metal, for example copper, silver, nickel or tin, or combinations thereof, e.g. tin plated copper, which may be deposited for example by an electroless deposition process and optionally built up by a further electrodeposition step. Examples of suitable electrodeposition processes are described in British patent application No. 2,113,022A mentioned above and in "Electroplating,—Fundamentals of Surface Finishing"—Frederick A. Lowenheim, McGraw Hill. The required thickness of the metal coating for a given performance level will depend on a number of factors including the coarseness or fineness of the fibres, the mean fibre separation, the free volume of the fabric and the metal chosen, the metal thickness normally being in the range of from 0.5 to 7 micrometers, especially from 1 to 4 micrometers. Preferably the plating thickness of the metal is chosen so that the fabric as a whole supports at least 20, more preferably at least 50 and especially at least 100 gm$^{-2}$ of metal but preferably not more than 500, more preferably not more than 300 and especially not more than 200 gm$^{-2}$ of metal. It is preferred for the fibres of the fabric to be relatively fine and the metal coating to be relatively thin rather than for the fibres to be coarse and the coating thick since the finer the fibres the higher the degree of conformability of the fabric for any given overall metal content. In addition, for any given weight and density of fabric, the finer the fibres are the smaller the apertures through the shield will usually be and so the higher the electromagnetic frequency can be for which screening to any given level may be obtained. The fibres preferably have a diameter of not more than 200, and especially not more than 50 micrometers, but preferably at least 0.5 and especially at least 5 micrometers. The fabric may, if desired, be provided instead with a different form of electrically conductive coating, for example the fabric may be impregnated with a coating formed from a conductive particle loaded polymer. However, the use of metal coated fabrics is preferred since their conductivity, and hence shielding effectiveness, is usually higher than that of shielding layers employing other conductive materials.

The fabric will usually be formed from polymeric fibres or mono-filaments, the particular choice of polymer not being critical to the invention, at least in its broadest aspects. Examples of polymers which may be used to form the fibres include polyolefins, e.g. high, medium and low density polyethylene, polyesters, e.g. polytetramethylene terephthalate, polyamides, e.g. nylon 6 and nylon 6,6, olefin copolymers, e.g. ethylene vinyl acetate copolymers, aromatic polymers, e.g. polyether ketones and polyether ether ketones and the like. Alternatively the fabric may be formed from natural fibres, e.g. cotton or silk or with mixtures of natural and synthetic fibres or it may be formed from glass or ceramic fibres or mixtures thereof. Furthermore the fabric may itself by formed from a metal or may be formed from a combination of metallic and non-metallic fibres. It is preferred, however, for the fabric to be formed from polymeric fibres and especially one in which the fibres are bonded to one another at "link points" rather than simply being interlocked. This has the advantage that when the fabric is coated with electrically conductive material a continuous electrical path will be formed along the fabric via the link points, that is to say, the electrical conductivity along the fabric is not dependent on loose physical contact between different fibres. Preferably the fibres of the fabric have a mean link point separation of at least 0.5, more preferably at least 1 and especially at least 3 mm, but preferably not more than 50, more preferably not more than 20 and especially not more than 10 mm. If the link point separation is too small, the fabric tends to become too rigid and in some circumstances the conductive coating may crack on recovery of the article with a consequential increase in fabric resistivity, while too large a link point separation is indicative of a fabric that has too coarse a structure for optimum screening.

It is possible in certain instance for the fabric to be held within the article simply by virtue of the relative dimensions of the fabric and the article although it is preferred for the fabric to be bonded to the internal surface of the article.

Preferably the fabric is impregnated with a fusible material for example a thermoplastic polymer and especially a hot-melt adhesive. The fabric may be impregnated with a hot-melt adhesive whether or not it is bonded to the article, although in most instances melting or softening of the hot-melt adhesive during recovery of the article will cause the fabric to adhere to the internal surface of the article. The fusible material may substantially fill the internal free space of the fabric for example so that the internal surface of the fabric is smooth. The presence of a fusible material such as a hot-melt adhesive has the advantage that the internal surface of the article as a whole is relatively smooth and therefore is less susceptible to damage on installation and will not retain any dust etc. to which it has been exposed in storage. Furthermore, the fusible material can protect the fabric from damage caused by general mechanical abuse. Examples of hot-melt adhesives that can be employed include those based on polyolefins, e.g. low or medium density polyethylene, olefin copolymers, e.g. ethylene vinyl acetate and ethylene ethyl acrylate, polyamides, e.g. those based on dimer diamines, and the like. Examples of hot-melt adhesives that are especially useful are given in U.S. Pat. Nos. 4,018,733 and 4,181,775, the disclosures of which are incorporated herein by reference. Alternatively, the fusible material may be a thermosetting adhesive which will fuse once only, during recovery of the article, and will thereafter become a relatively hard, infusible lining to the article. Examples of such materials include epoxy or epoxy/polyamide adhesives and phenolic resins. Advantageously they are in particulate form as described in British patent application No. 2,104,800A, the disclosure of which is incorporated herein by reference.

If desired the fusible material, or part of the fusible material, may be electrically non-conductive or it may be electrically conductive, for example it may comprise an inherently conductive polymer e.g. polyacetylene or a polypyrrole, or a low melting point metal or alloy, or it may comprise a non-conducting polymer that contains conductive particles, e.g. copper or silver flake e.g. to loadings of from 20 to 40% by volume. The use of a conductive fusible material is particularly advantageous where a conductive bond is required, e.g. in those parts of the articles which are intended to be recovered onto a cable or harness screen or onto a connector or connector adaptor. Alternatively in many cases the entire quantity of fusible material may be electrically non-conductive since good electrical connections between the fabric and the substrate, e.g. cable shield or connector, can still be achieved where the fusible material is non-conductive. Thus, according to another aspect, the invention provides a dimensionally recoverable article for enclosing at least part of an object, the article having an internal layer which may be for providing an electromagnetic shield or may for example be intended to provide an electrical connection between a conductive portion of the object such as a cable shield and a shield of the article, the internal layer comprising a fabric that is formed at least partly from electrically conductive fibres (including fibres that have been rendered conductive e.g. by coating a fabric as described above), the fabric being impregnated with a fusible, electrically non-conductive material.

Any polymeric material which can be cross-linked and to which the property of dimensional recoverability may be imparted such as those disclosed in U.K. specification No. 990,235 may be used to form the articles. Polymers which may be used as the polymeric material include polyolefins such as polyethylene and polypropylene, and the ethylene copolymers, for example with propylene, butene, hexene, octene, vinyl acetate or other vinyl esters or methyl or ethyl acrylate, polyamides, polyurethanes, polyvinyl chloride, polyvinylidine fluoride, or other fluorinated polymers or copolymers, e.g. Tefzel (trade name—commercially available from Dupont), elastomeric materials such as those disclosed in U.K. specification No. 1,010,064 and blends such as those disclosed in U.K. specifications Nos. 1,284,082 and 1,294,665, and compositions such as those disclosed in our U.S. Pat. No. 4,275,180. The polymeric materials can be tailored to suit the intended use by the addition of fillers, e.g. semiconducting fillers or anti-tracking agents, flame retardants, plasticisers, pigments, stabilisers and lubricants, or where necessary, e.g. where the polymeric material is substantially non-crystalline, a hold-out agent such as a thermoplastic polymer, e.g. polyethylene, may be included in the material.

The polymeric composition may be cross-linked either by the incorporation of a chemical crosslinking agent or by exposure to high energy radiation. Examples of suitable crosslinking agents are free radical initiators such as peroxides for example, dicumyl peroxide, 2,5-bis-(t-butyl peroxy)-2,5-dimethylhexane, 2,5-bis(t-butyl-peroxy)-2,5-dimethylhexyne-3, $\alpha, \alpha$ -bis-(t-butyl-peroxy)-di-isopropylbenzene. Other examples of appropriate cross-linking agents are disclosed in C. S. Sheppard & V. R. Kamath Polymer Engineering & Science 19 No. 9 597–606, 1979 "The Selection and Use of Free Radical Initiators" the disclosure of which is incorporated herein by reference. In a typical chemically cross-linked composition there will by about 0.5 to 5 weight per cent of peroxide based on the weight of the polymeric composition. The cross-linking agent may be employed alone or in association with a co-curing agent such as a polyfunctional vinyl or allyl compound, e.g. triallyl cyanurate, triallyl isocyanurate or pentaerythritol tetra methacrylate.

Radiation cross-linking may be effected by exposure to high energy irradiation such as an electron beam or gamma rays. Radiation dosages in the range 20 to 800 kGy, preferably 20 to 500 kGy, e.g. 20 to 200kGy and particularly 40 to 150 kGy are in general appropriate.

Certain forms of fabric described herein e.g. fabrics that are impregnated with fusible non-conductive materials, or fabrics that have the preferred openness of structure and the like are novel perse, and accordingly the preferred fabrics described above are considered as an aspect of the invention in their own right.

For the purpose of promoting cross-linking during irradiation preferably from 0.2 to 5 weight percent of a prorad such as a poly-functional vinyl or allyl compound, for example, triallyl cyanurate, triallyl isocyanurate or pentaerythritol tetramethacrylate are incorporated into the composition prior to irradiation.

Two articles in accordance with the present invention will now be described by way of example with reference to the accompanying drawings on which:

Figure 1:
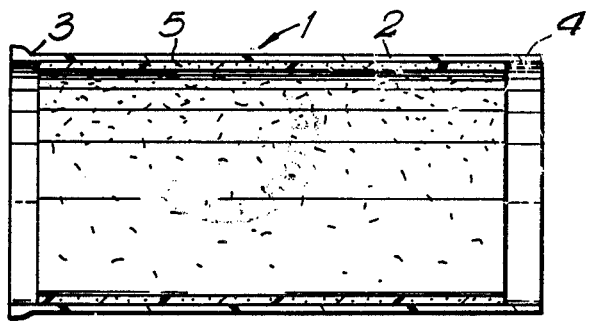
FIG. 1 is a sectional view along the axis of an article in accordance with the present invention.

Referring to FIG. 1 of the accompanying drawings, a heat-shrinkable moulded article 1 for enclosing a length of harness wiring that extends from a connector comprises a substantially cylindrical body portion 2 having two open ends 3 and 4. Open end 3 is provided with an internal lip or ridge for engaging a corresponding groove in a connector housing or connector adaptor. The internal surface of the article 1 is provided with a shielding layer 5 which comprises a non-woven mat of polyester fibres which has been coated with a binder, preferably an acrylic binder, to bond the fibres together, and, thereafter, with a layer of copper by an electroless plating method. The uncoated fibre mat has a density of 50 kgm$^{-3}$ and a thickness of 2 mm, corresponding to a surface weight of 100 gm$^{-2}$, and is plated with copper so that its weight increases to 250 gm$^{-2}$. The fabric is impregnated with a polyamide hot-melt adhesive so that the hot melt adhesive completely filled the fabric. The internal surface of the article in the region of open end 4 may be free of the shielding layer 5 as shown and may simply be provided with a thin layer of hot-melt adhesive in order to form a seal to the substrate about which it will be recovered, or may be completely uncoated with adhesive so that a freshly mixed two component epoxy adhesive may be applied when the article is recovered.

Figure 2:
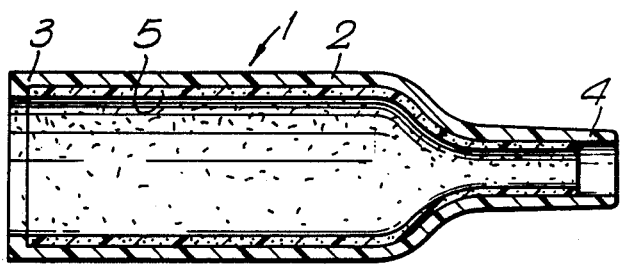
FIG. 2 is a sectional view along the axis of the article of FIG. 1 after recovery thereof.

The shielding article may be formed by moulding an appropriate polymeric material into the general configuration shown in FIG. 2, cross-linking the material and expanding the moulded article by means of a mandrel into a generally cylindrical configuration.

The shielding layer is formed by sewing together opposed edges of a fibre mat of 2-3 mm thickness to form a tube, chopping the tube into sections of appropriate length and immersing the chopped tube sections in an electroless plating bath until the fibre mat contains 120 to 150 gm$^{-2}$ of copper. Any of a number of commercially available electroless plating baths may be used, for example a plating bath as described in British patent specification No. 2,113,022. Alternatively the bath may employ a different complexing agent and/or the method may use a one step activation/nucleation employing a mixed tin-palladium catalyst.

The shielded article is assembled by wrapping a sheet, tape or short length of tube of a polyamide hot-melt adhesive about a mandrel, placing the plated mat over the hot melt adhesive and placing the heat-shrinkable article over the hot-melt adhesive and mat. The article is then heated briefly so that it partially recovers onto the mat and so that the hot-melt adhesive melts and impregnates the mat. After the article has been cooled and trimmed it is ready for use.

In order to enclose a harness termination, the article is simply slipped over the connector and harness wiring extending from the back of the connector and heated, for example by means of a hot-air gun, whereupon it recovers to a configuration as shown in FIG. 2 (the connector and harness not being shown). On recovery of the article the shielding layer contracts in the circumferential direction in order to accommodate the change in dimensions of the article, and also changes in shape from a generally cylindrical configuration to a generally "bottle-shaped" configuration. The end region of the shielding layer next to open end 3 of the article is forced into contact with metallic housing of the connector or adaptor while the opposite end of the shielding portion recovers into contact with the shield of the harness or cable.

Figure 3:
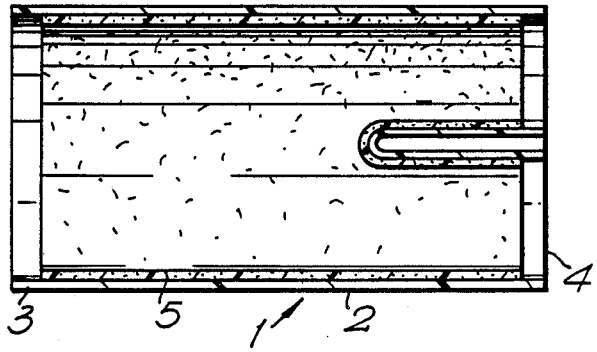
FIG. 3 is a sectional view of a second form of article according to the invention.
Figure 4:
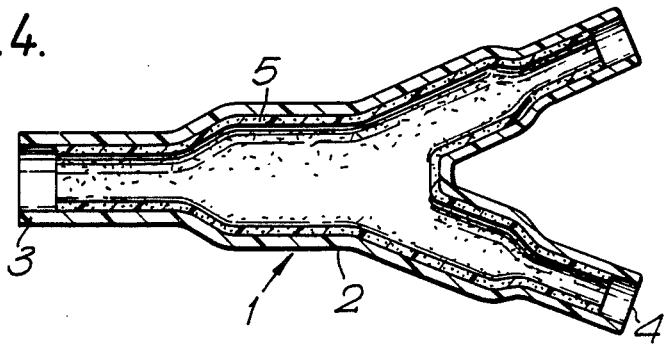
FIG. 4 is a sectional view of the article of FIG. 3 after recovery thereof.

FIG. 3 shows a second form of article according to the invention which is in the form of a transition or Y-piece, and FIG. 4 shows the article after recovery. As can be seen from the drawings the shape of the article changes considerably on recovery thereof, but the shielding layer 5 is able to accommodate the change in shape.

Figure 5:
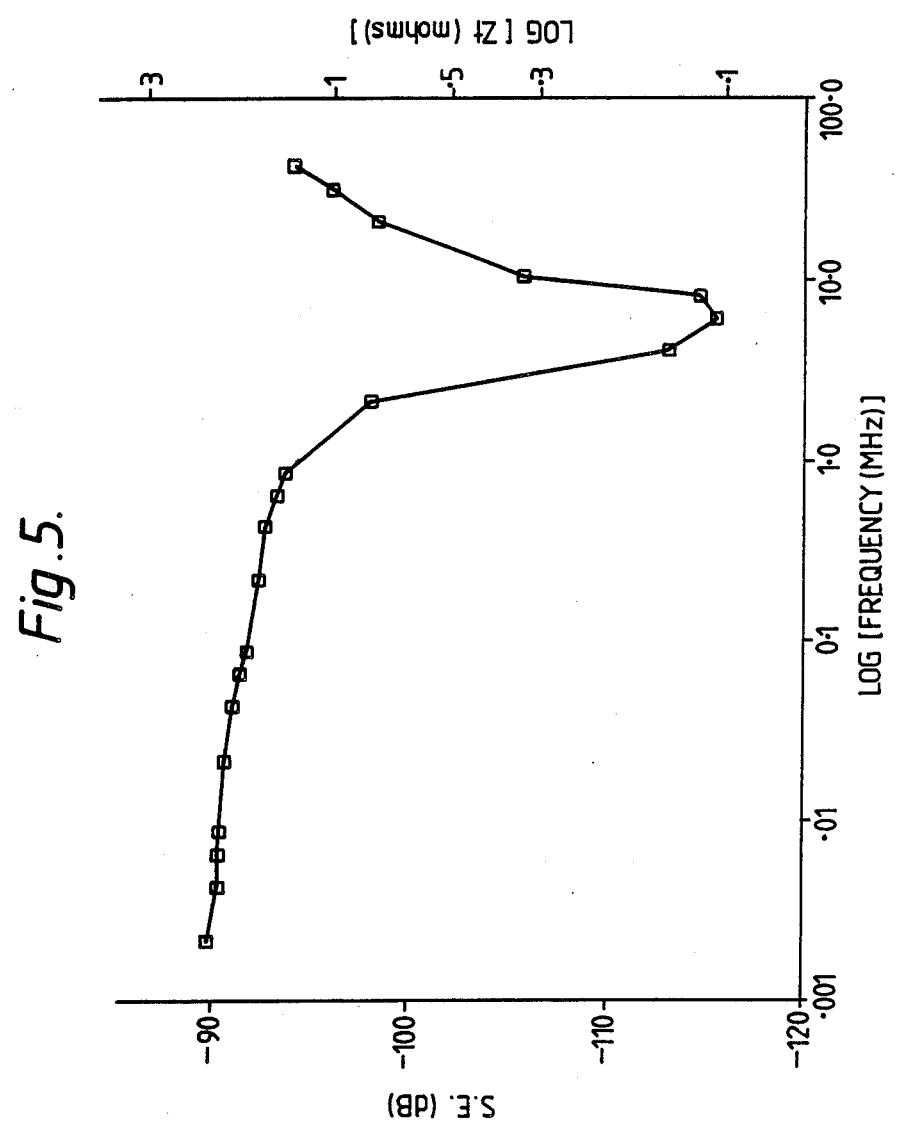
FIG. 5 is a graphical representation of the surface transfer impedance of an article after recovery.

FIG. 5 shows the screening efficiency (S.E.) and the surface transfer impedance (Zt) of the article shown in FIG. 1 at frequencies from 1 kHz to 100 MHz.

The surface transfer impedance was determined generally in accordance with the international specification IEC 96 and British Standard 2316 and as described in the brochure entitled "Optimised and Superscreened Cables" available from Raychem Ltd., Wire & Cable Division, Faraday Road, Dorcan, Swindon, Wilts, England.

We claim:

1. A dimensionally recoverable article for enclosing at least part of an object and providing an electro magnetic shield, the article having a shielding layer which comprises non-woven fabric that has been coated with an electrically conductive material to render it sufficiently conductive to provide electro-magnetic shielding.

2. An article as claimed in claim 1, including electrically conductive fibers selected from the group consisting of metalic fibres, nonconductive fibres coated with an electrically conductive material, inherently conductive polymer fibres, or combinations thereof.

3. An article as claimed in claim 2, wherein the fabric has a density in the range of from 12 to 1800 kgm$^{-3}$.

4. An article as claimed in claim 2, wherein the shielding layer has a weight in the range of from 60 to 1200 gm$^{-2}$.

5. An article as claimed in claim 2, wherein the fibres are formed from an electrically non-conductive material and have been coated with an electrically conductive material to render them electrically conductive.

6. An article as claimed in claim 1, wherein the fabric has an open structure in order to enable it to conform to the configuration of the article during recovery thereof.

7. An article as claimed in claim 1, wherein the fabric comprises polymeric fibres.

8. An article as claimed in claim 5, wherein the electrically conductive material comprises a metal.

9. An article as claimed in claim 6, wherein the uncoated fabric has a density in the range of from 2 to 300 kgm$^{-3}$.

10. An article as claimed in claim 1, wherein the shielding layer has from 20 to 500 gm$^{-2}$ of conductive material.

11. An article as claimed in claim 1, wherein the fabric has a thickness in the range of from 0.5 to 5 mm.

12. An article as claimed in claim 1, wherein the fibres in the fabric are bonded together at link points.

13. An article as claimed in claim 12, wherein the fibres of the fabric have a mean link point separation in the range of from 0.1 to 2 mm.

14. An article as claimed in claim 1, wherein the proportion of the fabric volume occupied by the fibres is not more than 10%.

15. An article as claimed in claim 1, wherein the fabric is impregnated with a fusible material.

16. An article as claimed in claim 15, wherein the fusible material is a hot-melt adhesive.

17. An article as claimed in claim 15, wherein the fusible material substantially fills the free space of the fabric.

18. An article as claimed in claim 15, wherein the fusible material is electrically non-conductive.

19. An article as claimed in claim 15, wherein the fusible material comprises a thermosetting adhesive.

20. An article according to claim 1, wherein the non-woven fabric is selected from the group consisting of a non-woven electrodeposition fabric, non-woven electroplated fabric, a non-woven fabric impregnated with a coating formed from a conductive particle loaded polymer, or combinations thereof.

21. A dimensionally recoverable article for enclosing at least part of an object, the article having an internal layer which comprises a fabric that is formed at least partly from electrically conductive fibres, the fabric being impregnated with a fusible electrically non-conductive material.

22. An article according to claim 21 wherein the fabric is formed from fibres selected from the group consisting of electrodeposition of fibres, electroplating on fibres, impregnating the fibres with a coating formed from a conductive particle loaded polymer, or mixtures thereof.

* * * * *